(12) United States Patent
Gui

(10) Patent No.: US 7,116,402 B2
(45) Date of Patent: Oct. 3, 2006

(54) LITHOGRAPHIC APPARATUS AND DEVICE MANUFACTURING METHOD

(75) Inventor: Cheng-Qun Gui, Best (NL)

(73) Assignee: ASML Netherlands B.V, Veldhoven (NL)

( * ) Notice: Subject to any disclaimer, the term of this patent is extended or adjusted under 35 U.S.C. 154(b) by 63 days.

(21) Appl. No.: 10/922,106

(22) Filed: Aug. 20, 2004

(65) Prior Publication Data

US 2005/0200821 A1    Sep. 15, 2005

Related U.S. Application Data

(63) Continuation-in-part of application No. 10/795,802, filed on Mar. 9, 2004, now Pat. No. 6,967,711.

(51) Int. Cl.
*G03B 27/54* (2006.01)
*G03B 27/42* (2006.01)

(52) U.S. Cl. ......................... 355/57; 355/53

(58) Field of Classification Search ................. 355/52, 355/53, 55, 67–71; 430/5, 20, 30; 356/399–401; 359/618, 663; 250/548, 492.2
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,060,224 A * | 5/2000 | Sweatt et al. | 430/395 |
| 6,133,986 A * | 10/2000 | Johnson | 355/67 |
| 6,177,980 B1 | 1/2001 | Johnson | |
| 6,379,867 B1 * | 4/2002 | Mei et al. | 430/296 |
| 6,424,404 B1 | 7/2002 | Johnson | |
| 6,515,257 B1 * | 2/2003 | Jain et al. | 219/121.73 |
| 6,687,041 B1 | 2/2004 | Sandstrom | |
| 6,747,783 B1 | 6/2004 | Sandstrom | |
| 6,795,169 B1 | 9/2004 | Tanaka et al. | |
| 6,806,897 B1 | 10/2004 | Kataoka et al. | |
| 6,811,953 B1 | 11/2004 | Hatada et al. | |
| 6,841,787 B1 | 1/2005 | Almogy | |
| 6,967,711 B1 | 11/2005 | Gui | |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

WO    WO 98/33096    7/1998

U.S. PATENT DOCUMENTS

FOREIGN PATENT DOCUMENTS

*Primary Examiner*—Henry Hung Nguyen
(74) *Attorney, Agent, or Firm*—Sterne, Kessler, Goldstein & Fox P.L.L.C.

(57) ABSTRACT

A system and method are used to form features on a substrate. The system and method include using a first array including individually controllable elements that selectively pattern a beam of radiation, a second array including sets of lenses and apertures stops that form an image from a respective one of the individually controllable elements in a first plane, a third array including lenses that form an image from a respective one of the second array in a second plane, and a substrate table that holds a substrate in the second plane, such that the substrate receives the image from the respective one of the second array. A same spacing is formed between elements in the first, second, and third arrays.

7 Claims, 6 Drawing Sheets

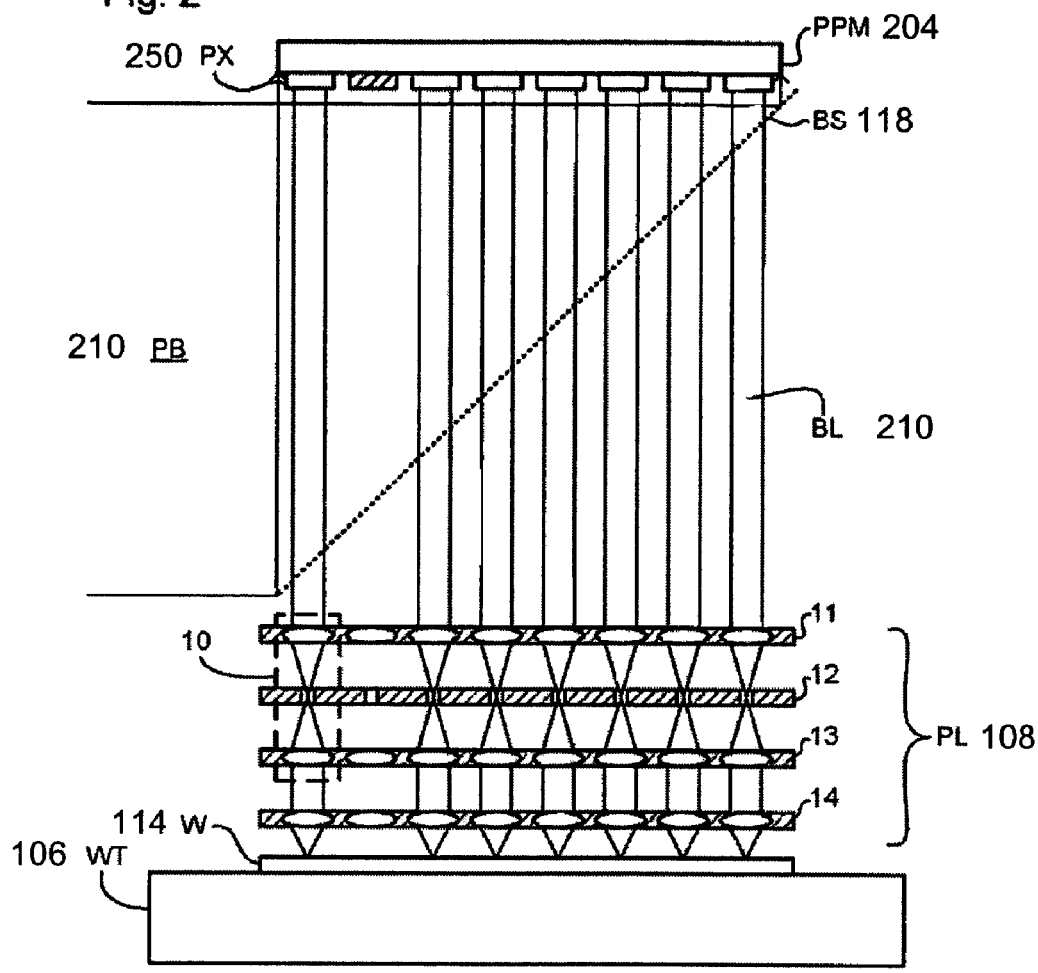
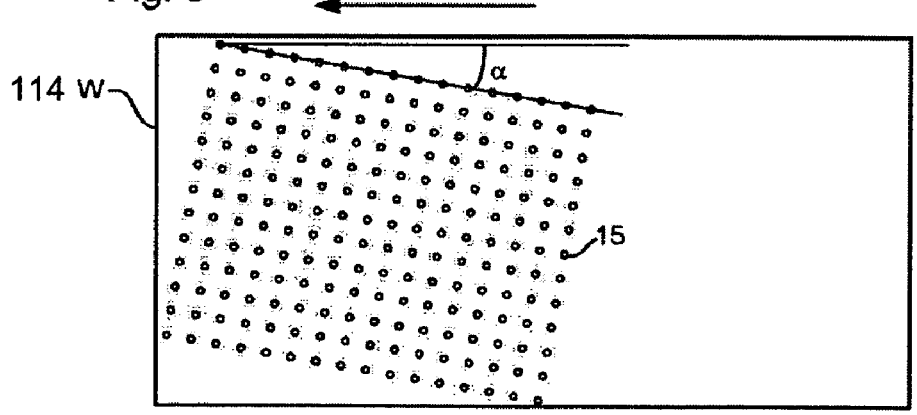

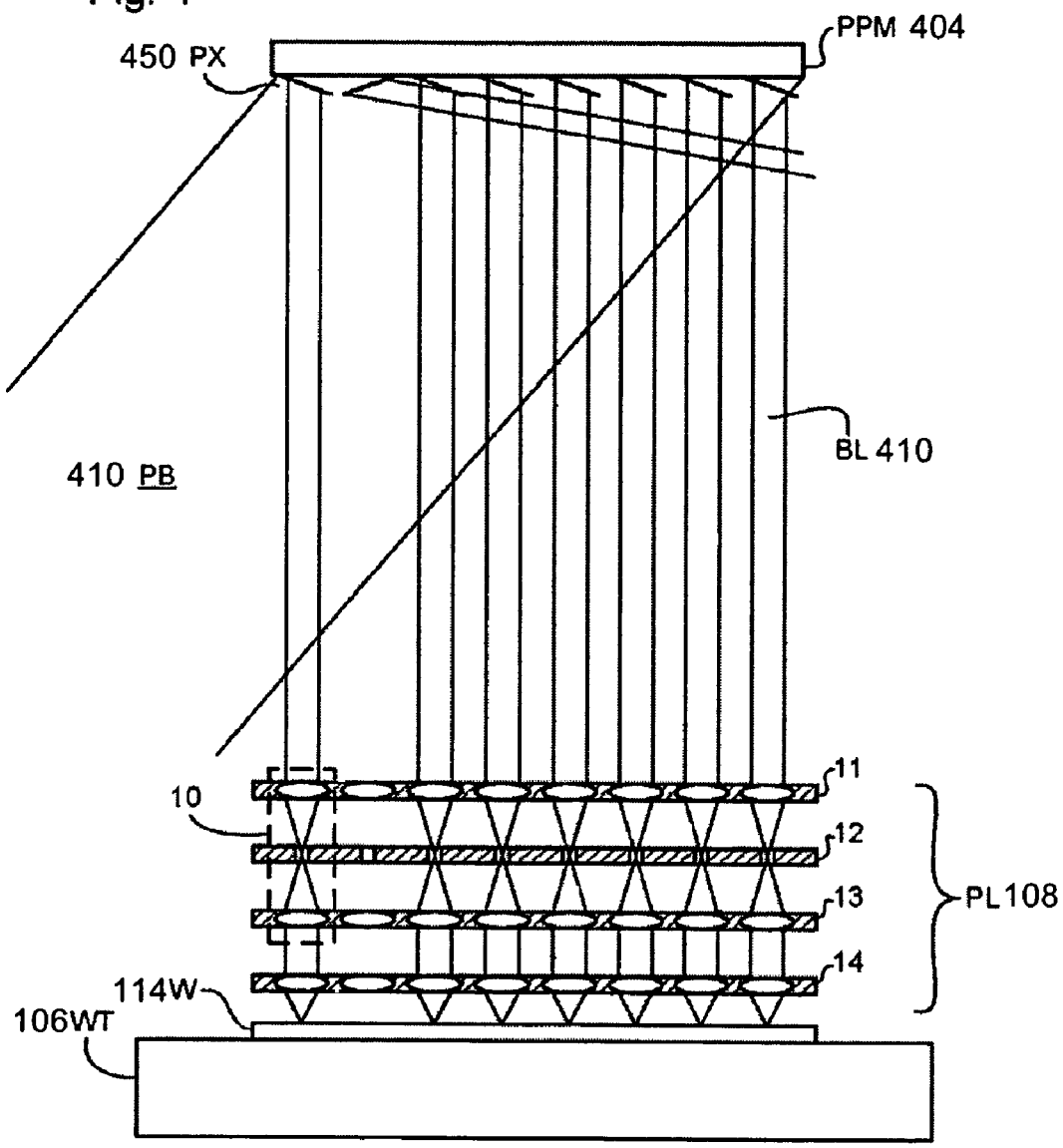

LITHOGRAPHIC APPARATUS AND DEVICE MANUFACTURING METHOD

CROSS REFERENCE TO RELATED APPLICATIONS

This application is a continuation-in-part of U.S. Ser. No. 10/795,802, filed Mar. 9, 2004, which in now U.S. Pat. No. 6,967,711 which is incorporated by reference herein in its entirety.

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays and other environments requiring patterning of fine structures. In a conventional lithographic apparatus, a patterning device, which is alternatively referred to as a mask or a reticle, may be used to generate a circuit pattern corresponding to an individual layer of the IC (or other device), and this pattern can be imaged onto a target portion (e.g., part of one or several dies) on a substrate (e.g., a silicon wafer, glass plate, or the like) that has a layer of radiation-sensitive material (e.g., resist). In a maskless lithography system, instead of a mask, the patterning device may include an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning"-direction), while synchronously scanning the substrate parallel or anti-parallel to this direction.

In view of the high costs of masks for use in lithographic processes and the length of time required to manufacture them, maskless lithographic systems including programmable patterning devices (e.g., spatial light modulators, contrast devices, etc.) have been developed. The programmable patterning devices are programmed (e.g., electronically or optically) to form the desired mask pattern and impart it to the beam. Types of programmable patterning means that have been proposed include micro-mirror arrays, LCD arrays, grating light valve arrays, and the like.

An example lithographic apparatus employing a programmable patterning device is found in U.S. Pat. No. 6,498,685 (the '685 patent), which is incorporated herein by reference in its entirety. In the '685 patent, a collimated illumination beam is directed onto a micro-mirror array so that the mirrors of the micro-mirror array either direct light via a beam expander onto a respective microlens in a microlens array or direct light out of the optical system. Example systems using microlens arrays to project images of masks are disclosed in U.S. Pat. No. 5,517,279 and PCT Patent Application WO 94/11781. The microlens array forms an array of small spots on a substrate and the micro-mirrors effectively act as switches to turn individual spots in the array of small spots ON and OFF. By scanning the substrate relative to the array of small spots, which is inclined to the scanning direction, as the spots are selectively activated, features corresponding to a pattern in the micro-mirror array can be built up on the substrate.

The beam expander is desirable to create a useful size imaging field because the programmable patterning device is relatively small. However, this means that the array of small spots at the substrate level is quite sparse and if the spots are small, to give a reasonable resolution, the array must be wide and inclined at only a small angle to the scanning direction in order to be able to address the whole surface of the substrate. The beam expander is complex and requires a significant amount of space. It is also a significant additional cost and additional source of errors, especially a large field lens in the beam expander. Furthermore, it reduces the optical transmission of the apparatus.

Therefore, what is needed is system and method using a lithographic projection apparatus without a beam expander that includes a programmable patterning device in which the lithographic projection apparatus can be simpler in structure than conventional devices and more compact.

SUMMARY OF THE INVENTION

An embodiment of the present invention provides a programmable patterning device comprising a first substrate and a second substrate. The first substrate has an array of contrast elements and a transmissive region or aperture adjacent each contrast element. The second substrate has an array of reflectors corresponding in number and arrangement to the array of contrast elements. Each reflector is positioned to direct radiation passing through a respective one of the transmissive regions or apertures to a respective one of the contrast elements, or vice versa.

Another embodiment of the present invention provides a lithographic apparatus comprising an illumination system that supplies a beam of radiation, a patterning array including individually controllable elements that selectively divide the beam of radiation into a plurality of sub-beams modulated according to a desired pattern on the patterning array, a substrate table that supports a substrate, such that the substrate is positioned to receive the plurality of sub-beams. The patterning array is a programmable patterning device comprising a first substrate and a second substrate. The first substrate has thereon an array of contrast elements and a transmissive region or aperture adjacent each contrast element. The second substrate has an array of reflectors corresponding in number and arrangement to the array of contrast elements. Each reflector is positioned to direct radiation passing through a respective one of the transmissive regions or apertures to a respective one of the contrast elements, or vice versa.

A still further embodiment of the present invention provides a device manufacturing method comprising the following steps. Using a patterning device to selectively divide a beam of radiation into a plurality of sub-beams modulated according to a desired pattern on the patterning device. The pattering device including a first substrate and a second substrate. The first substrate having thereon an array of contrast elements and a transmissive region or aperture adjacent each contrast element. The second substrate having an array of reflectors corresponding in number to the array of contrast elements. Each reflector in the array of reflectors being positioned to direct radiation between a respective one of the transmissive regions or apertures to a respective one of the contrast elements in one or both directions. Positioning a substrate to receive the plurality of sub-beams.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 2 depicts a patterning device, projection system, and substrate table of the apparatus in FIG. 1 in greater detail, according to one embodiment of the present invention.

FIG. 3 is a view showing an inclination of the image spot array relative to the substrate scanning direction, according to one embodiment of the present invention.

Figure 1:
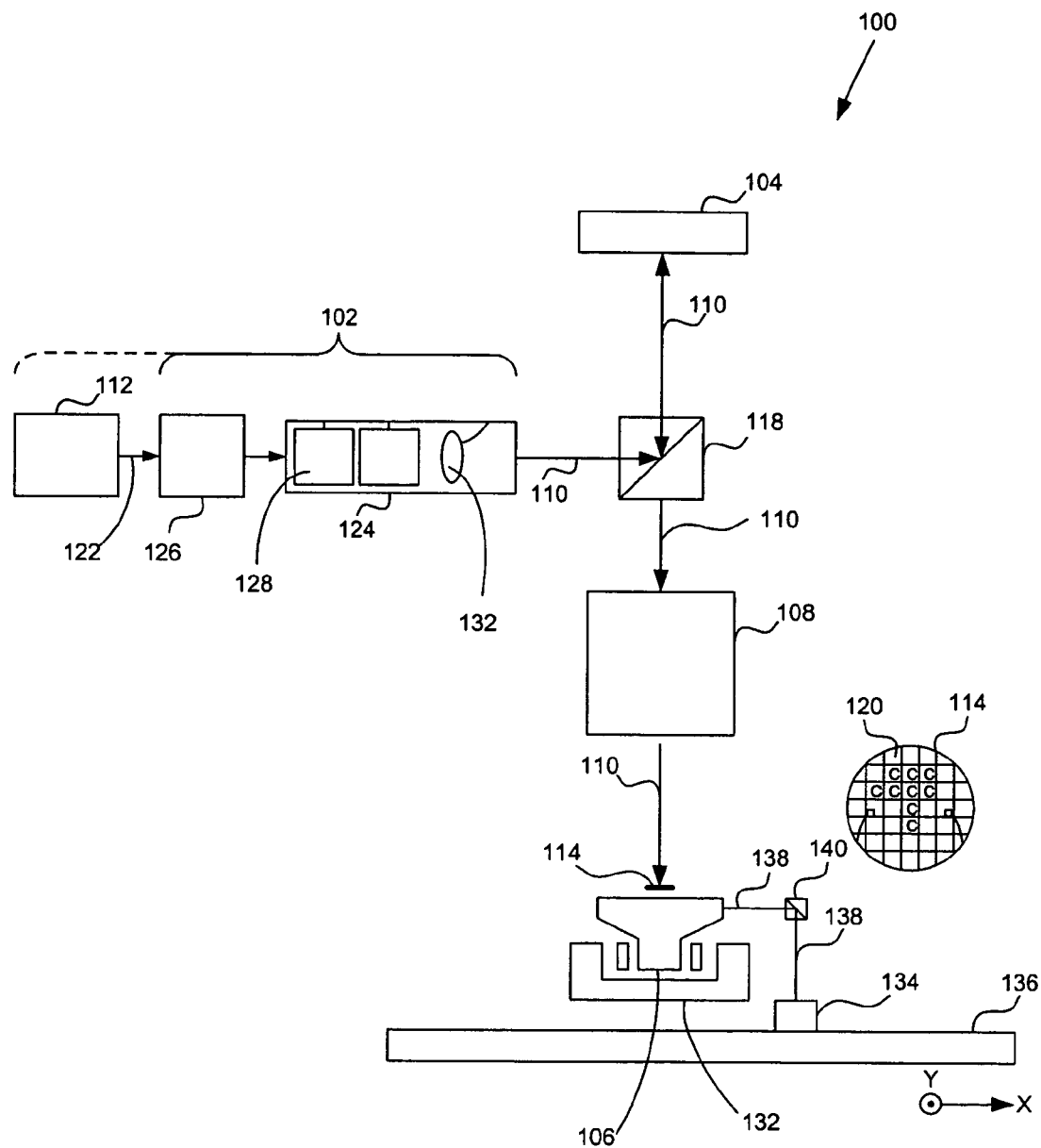
FIG. 1 depicts a lithographic apparatus, according to a one embodiment of the present invention.

FIGS. 4, 5, 6, and 7 depict a patterning device, projection system, and substrate table, according to various embodiments of the present invention.

The present invention will now be described with reference to the accompanying drawings. In the drawings, like reference numbers may indicate identical or functionally similar elements.

DETAILED DESCRIPTION OF THE INVENTION

Overview and Terminology

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

In the embodiment shown in FIG. 1, array of individually controllable elements 104 is a programmable mirror array. Programmable mirror array 104, comprises a matrix arrangement of tiny mirrors, each of which can be individually tilted about an axis. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern.

In one example, the series of states includes: (a) a black state in which radiation reflected by the mirror makes a minimum, or even a zero contribution to the intensity distribution of its corresponding pixel; (b) a whitest state in which the reflected radiation makes a maximum contribution; and (c) a plurality of states in between in which the reflected radiation makes intermediate contributions. The states are divided into a normal set, used for normal beam patterning/printing, and a compensation set, used for compensating for the effects of defective elements. The normal set comprises the black state and a first group of the intermediate states. This first group will be described as grey states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states are being described as white states, it will be appreciated that this is simply to facilitate the distinction between the normal and compensatory exposure steps. The entire plurality of states could alternatively be described as a sequence of grey states, between black and white, selectable to enable grey-scale printing.

Exemplary Imaging Arrangements

FIG. 2 shows a configuration of an imaging arrangement of the invention according to an embodiment of the present invention. The beam 210 PB supplied by the radiation system 102 is directed onto the programmable patterning device 204 PPM using beam splitter 118 BS. The return sub-beams 210 BL, whose intensity is based on a state (e.g., all or partially ON or OFF) of a respective pixel 250 PX of the programmable patterning means 204, pass through the beamsplitter 118 BS into respective microlens sets 10.

In one embodiment, an array of the microlens sets 10 can include two microlens arrays 11, 13 between which is an aperture plate 12, which defines an aperture for each of the microlens sets 10. The microlens sets 10 can have a relatively low numerical aperture (NA) (e.g., NA<0.1) and each can focus the images of the corresponding pixel 250 PX onto a respective lens element of field microlens array 14, which has a relatively high NA (e.g., NA>0.1). In a preferered embodiment, NA is in the range of from about 0.15 to about 0.3. In field microlens array 14, each microlens focuses a respective one of the aperture stops in the aperture plate 12 of the corresponding microlens set 10 onto its focal plane to form an image spot. The lower NA of the microlens sets 10 can provide sufficient space between the programmable patterning device 104 and the field microlenses 14 to form desirable images, while the higher NA of the field microlenses 14 can provide a small spot for high-resolution imaging.

In this embodiment, the substrate 114 is scanned through the focal plane (image plane) of the field microlens array 14, while the sub-beams, and hence the image spots, are switched at least partially ON or fully ON and OFF by the programmable patterning device 204. Features corresponding to the pattern of the programmable patterning device 204 are formed on the substrate 114.

It will be appreciated that in this embodiment the projection system 100 can be a 1:1 projection system in that the array spacing of the image spots on the substrate 114 is the same as the array spacing of the pixels of the programmable patterning means 204 PPM. To provide improved resolution, the image spots can be much smaller that the pixels of the programmable patterning means 204.

In one embodiment to ensure the whole surface area of the substrate 114 is addressed, the programmable patterning device 204 and projection systems 108 PL can be inclined to the scanning direction Vs, as shown in FIG. 3. The angle of inclination α and the width of the array in the scanning direction are determined in accordance with the image spot size and array spacing in the direction perpendicular to the scanning direction to ensure complete coverage.

In one embodiment, for large substrates a plurality of optical engines, each comprising a programmable patterning device 204 and a projection system 108, may be arranged in a staggered line across the width of the substrate 114. The different optical engines may be supplied with radiation from a common radiation source or separate sources.

In one embodiment, the patterning array, the array of microlens sets, and the array of field microlenses each have a width in the range of from about 50 mm to about 500 mm.

Other Exemplary Imaging Arrangements

FIG. 4 shows a configuration of an imaging arrangement of the invention according to an embodiment of the present invention. In this embodiment, there is no beam splitter. Although not specifically, shown, the collimated beam 410 is directed onto the programmable patterning device 404 PPM at an angle α (not shown), such that one state of the elements of the programmable patterning device 404 directs light into the microlens sets 10, while the other state directs light away from the microlens sets 10. It is to be appreciated that some programmable patterning devices 404 can include more than two states (e.g., varying ON states), which are contemplated within the scope of the present invention. The value of angle α depends on the difference in the angles light is directed by the programmable patterning device 404 in its at least two states. In one example using a digital mirror device, the mirrors commonly may be set at about ±10–15°, while in a grating light valve the first order may be at about ±25–35° to the zeroth order.

Figure 5:
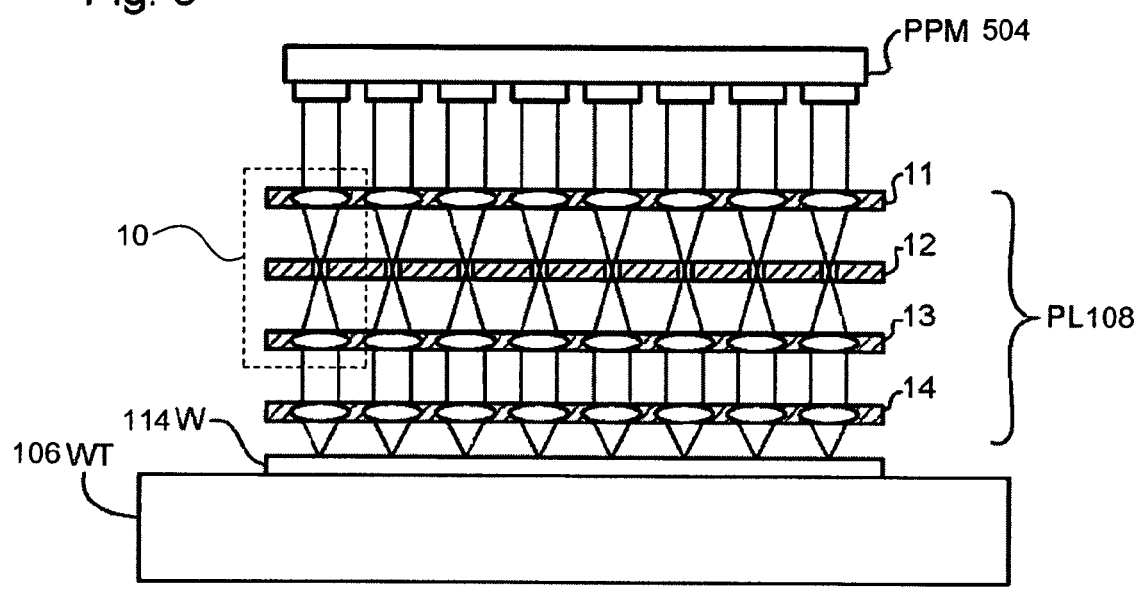

FIG. 5 shows a configuration of an imaging arrangement of the invention according to an embodiment of the present invention. In this embodiment, which may be the same as the FIG. 1 except as described below, employs a self-emissive contrast device, such as an array of light emitting diodes (LEDs), organic LEDs (OLEDs), polymer LEDs (PLEDs), or solid state laser diodes, as the programmable patterning device 504. With a self-emissive device, the beam splitter can be omitted and the device made considerably more compact.

Figure 6:
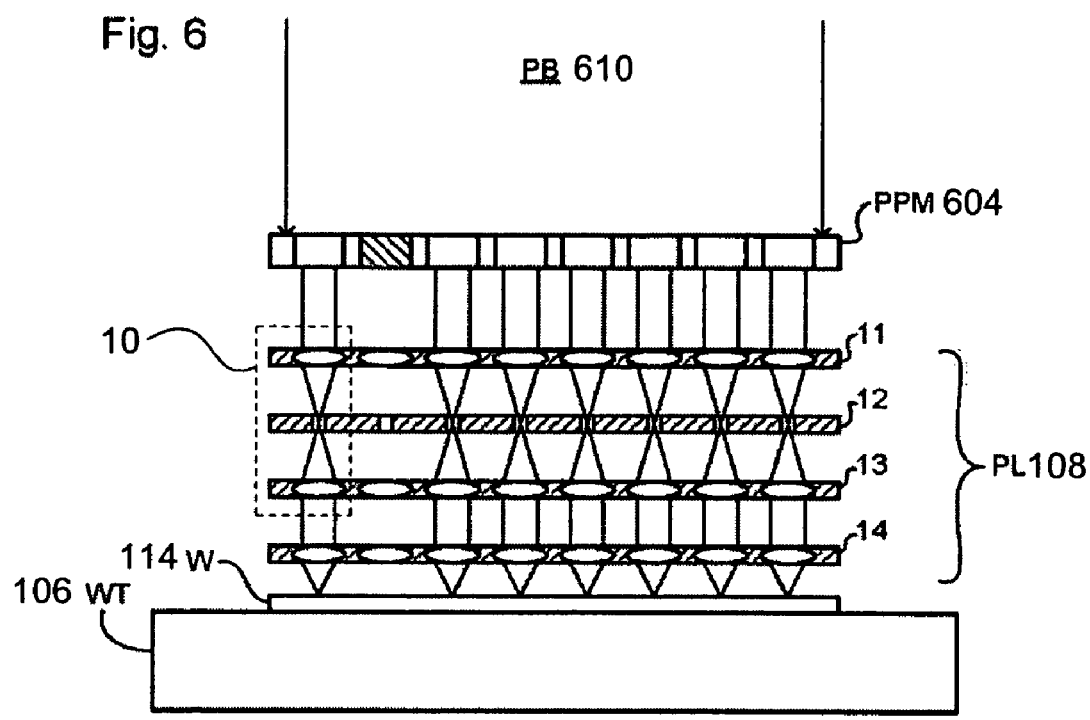

FIG. 6 shows a configuration of an imaging arrangement of the invention according to an embodiment of the present invention. This is similar to FIG. 2, but uses a transmissive device, such as an LCD panel, as the programmable patterning device 604. As with FIG. 12, a more compact device can again be provided as compared to conventional lithographic systems.

Figure 7:
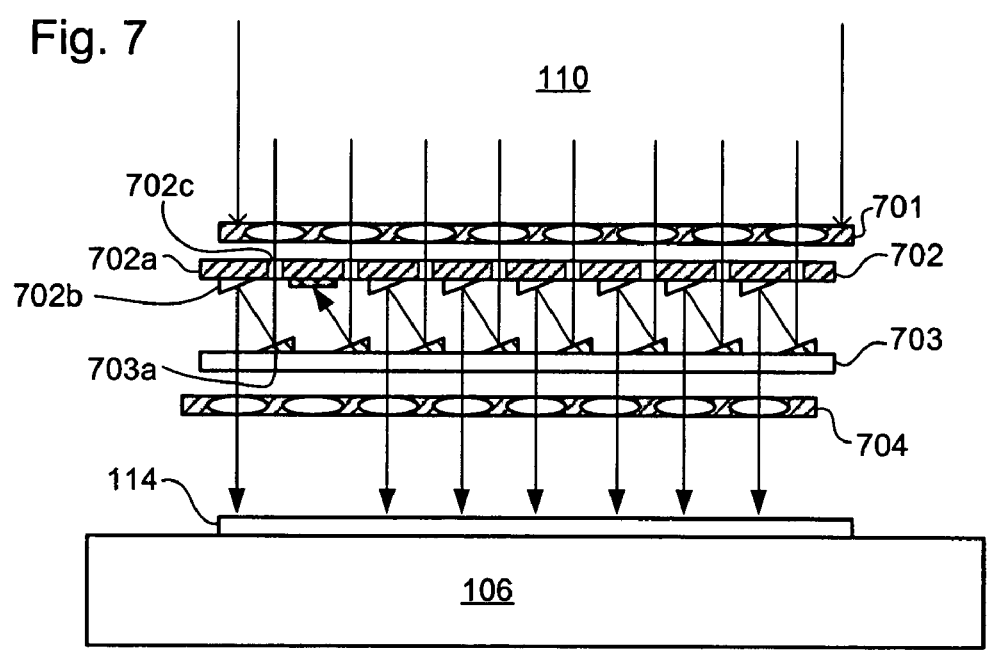

FIG. 7 shows a configuration of an imaging arrangement of the invention, according to one embodiment of the present invention. In this embodiment, the aperture plate is incorporated into a programmable patterning device 702, which comprises an opaque substrate 702a to support an array of contrast elements 702b. An aperture 702c is provided in substrate 702a adjacent each contrast element 702b. The back of substrate 702a faces beam 110 supplied by the illumination system (not shown in this figure), and a microlens array 701 divides beam 110 into individual beamlets per pixel, directing them through apertures 702c in substrate 702a of the programmable patterning means 702. Opposite each aperture 702c is an angled mirror 703a, carried on a transparent support 703, that directs the respective beamlet onto a respective contrast element 702b.

Depending on a state of the respective contrast element 702b, the beamlet is either directed to substrate 114 on substrate table 106, being focused thereon by a respective microlens of array 704, or blocked. If, for example, programmable patterning means 702 is a programmable mirror array so that each contrast element 702b is a mirror whose angle can be controlled, setting a mirror to one angle will direct the respective beamlet toward the substrate 114, while setting it to another will direct the beamlet elsewhere, e.g., out of the optical path, towards an opaque region provided on transparent substrate 703 or back towards the illumination system.

It will be appreciated that many variations on the above arrangement are possible. For example, programmable patterning device 702 and transparent substrate 703 can be reversed. Substrate 702a of programmable patterning means 702 can be made transparent or provided with transparent regions instead of apertures. The input side microlens array 701 can be omitted. Projection optics can be provided between output microlens array 704 and substrate 114, e.g. to reduce the size of the pixel grid on the substrate or to increase the working distance. The output microlens array can be defined in or on the same substrate as carries the static reflectors. The static mirror array can be replaced by a second contrast device, such as a programmable mirror array. This can increase contrast and/or the number or gray levels that can be defined by the device. The combination of programmable patterning array 702 and static mirror array (or second programmable mirror array), with or without the microlens arrays, can be used as a transmissive programmable patterning means in other designs.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A programmable patterning device, comprising:
    a first substrate having thereon an array of contrast elements and a transmissive region or aperture adjacent each contrast element; and a second substrate having an array of reflectors corresponding in number to the array of contrast elements, each reflector in the array of reflectors being positioned to direct radiation between a respective one of the transmissive regions or apertures to a respective one of the contrast elements in one or both directions.

2. The programmable patterning device of claim 1, further comprising:
a microlens array having array of microlenses, a number of the microlenses corresponding a number of contrast elements in the array of contrast elements and being positioned to concentrate incident radiation onto the contrast elements either directly or via the transmissive regions or apertures and reflectors.

3. The programmable patterning device of claim 1, further comprising:
a microlens array having array of microlenses, a number of the microlenses corresponding a number of contrast elements in the array of contrast elements and being positioned to focus radiation selectively passed by respective ones of the contrast elements into an array of microspots.

4. The programmable patterning device of claim 1, wherein the contrast elements are mirrors having a selectively programmed orientation.

5. The programmable patterning device of claim 1, wherein the reflectors on the second substrate are mirrors having a selectively programmed orientation.

6. A lithographic apparatus, comprising:
an illumination system that supplies a beam of radiation;
a patterning array including individually controllable elements that selectively divide the beam of radiation into a plurality of sub-beams modulated according to a desired pattern of the patterning array; and
a substrate table that supports a substrate, such that the substrate is positioned to receive the plurality of sub-beams,
wherein the patterning array is a programmable patterning device comprising,
a first substrate having thereon an array of contrast elements and a transmissive region or aperture adjacent each contrast element, and
a second substrate having an array of reflectors corresponding in number to the array of contrast elements, each reflector being positioned to direct radiation between a respective one of the transmissive regions or apertures to a respective one of the contrast elements in one or both directions.

7. A device manufacturing method, comprising:
using a patterning device to selectively divide a beam of radiation into a plurality of sub-beams modulated according to a desired pattern on the patterning device, the patterning device including,
a first substrate having thereon an array of contrast elements and a transmissive region or aperture adjacent each contrast element, and
a second substrate having an array of reflectors corresponding in number to the array of contrast elements, each reflector in the array of reflectors being positioned to direct radiation between a respective one of the transmissive regions or apertures to a respective one of the contrast elements in one or both directions; and
positioning a substrate to receive the plurality of sub-beams.

* * * * *